United States Patent
Kim et al.

(10) Patent No.: US 10,109,506 B2
(45) Date of Patent: *Oct. 23, 2018

(54) UNIT FOR SUPPLYING FLUID, APPARATUS AND METHOD FOR TREATING SUBSTRATE WITH THE UNIT

(71) Applicant: SEMES CO., LTD., Chungcheongnam-do (KR)

(72) Inventors: Heehwan Kim, Sejong-si (KR); Young Hun Lee, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/604,141

(22) Filed: May 24, 2017

(65) Prior Publication Data

US 2017/0345687 A1  Nov. 30, 2017

(30) Foreign Application Priority Data

May 26, 2016 (KR) ........................ 10-2016-0064800

(51) Int. Cl.
*H01L 21/67* (2006.01)
*H01L 21/02* (2006.01)

(52) U.S. Cl.
CPC .. *H01L 21/67051* (2013.01); *H01L 21/02101* (2013.01); *H01L 21/67017* (2013.01); *H01L 21/6719* (2013.01)

(58) Field of Classification Search
CPC ......... H01L 21/67051; H01L 21/02101; H01L 21/67017; H01L 21/6719; B08B 3/08; B08B 3/14

USPC ........................................................... 34/357
See application file for complete search history.

(56) References Cited

U.S. PATENT DOCUMENTS

| | | | | | |
|---|---|---|---|---|---|
| 5,303,482 | A | * | 4/1994 | Yamashita | ........ H01L 21/67769 34/218 |
| 5,940,985 | A | * | 8/1999 | Kamikawa | ........ H01L 21/67034 257/E21.228 |
| 6,920,703 | B2 | * | 7/2005 | Taktsu | ...................... G03F 7/40 134/902 |
| 7,065,898 | B2 | * | 6/2006 | Kim | .................. H01L 21/67017 34/78 |
| 7,326,265 | B2 | * | 2/2008 | Zilliox | .................. B01D 41/02 422/178 |

(Continued)

FOREIGN PATENT DOCUMENTS

| | | |
|---|---|---|
| JP | 2007-234862 A | 9/2007 |
| JP | 6135903 B2 * | 5/2017 |

(Continued)

*Primary Examiner* — Stephen M Gravini
(74) *Attorney, Agent, or Firm* — Li & Cai Intellectual Property (USA) Office

(57) ABSTRACT

Provided is an apparatus and method for supplying a fluid. The substrate treating apparatus comprises a treating unit for treating a substrate and a fluid supply unit for supplying fluid to the treating unit, wherein the fluid supply unit comprises a supply tank in which the fluid is stored, a supply line connecting the supply tank and the treating unit to supply the fluid from the supply tank to the treating unit, a filter installed on the supply line, and an exhaust line branching from the supply line, wherein a branch point of the exhaust line in the supply line is located upstream of the filter.

10 Claims, 8 Drawing Sheets

(56) References Cited

U.S. PATENT DOCUMENTS

| | | | |
|---|---|---|---|
| 7,654,010 B2* | 2/2010 | Moriya | H01L 21/67017 118/65 |
| 7,992,318 B2* | 8/2011 | Kawaji | H01L 21/67109 118/58 |
| 8,640,359 B2* | 2/2014 | Aihara | H01L 21/02041 34/341 |
| 8,661,704 B2* | 3/2014 | Nakashima | F26B 3/00 34/198 |
| 8,701,308 B2* | 4/2014 | Hiroshiro | H05B 3/0052 118/723 E |
| 9,275,847 B2* | 3/2016 | Jung | H01L 21/00 |
| 9,453,614 B2* | 9/2016 | Smith | F17D 3/16 |
| 9,506,695 B2* | 11/2016 | Kim | F26B 21/003 |
| 2008/0060681 A1* | 3/2008 | Choo | B08B 3/10 134/26 |
| 2014/0290092 A1* | 10/2014 | Jung | B08B 7/0021 34/570 |
| 2015/0162221 A1* | 6/2015 | Lee | H01L 21/67028 156/345.26 |
| 2016/0115594 A1* | 4/2016 | Moroi | C23C 16/45561 118/728 |
| 2017/0018442 A1* | 1/2017 | Oh | H01L 21/67051 |
| 2017/0241017 A1* | 8/2017 | Miyamoto | C23C 16/455 |
| 2017/0345687 A1* | 11/2017 | Kim | H01L 21/67017 |
| 2018/0065065 A1* | 3/2018 | Sasa | B01D 29/606 |

FOREIGN PATENT DOCUMENTS

| | | |
|---|---|---|
| KR | 10-2001-0014594 A | 2/2001 |
| KR | 100821232 B1 * | 4/2008 |
| KR | 10-2011-0101045 A | 9/2011 |
| KR | 10-2012-0057504 A | 6/2012 |
| KR | 10-2013-0052991 A | 5/2013 |

\* cited by examiner

UNIT FOR SUPPLYING FLUID, APPARATUS AND METHOD FOR TREATING SUBSTRATE WITH THE UNIT

CROSS-REFERENCE TO RELATED APPLICATIONS

A claim for priority under 35 U.S.C. § 119 is made to Korean Patent Application No. 10-2016-0064800 filed on May 26, 2016 in the Korean Intellectual Property Office, the entire contents of which are hereby incorporated by reference.

BACKGROUND OF THE INVENTION

The present invention disclosed herein relates to an apparatus and method for treating a substrate with a fluid, and more particularly to an apparatus and method for supplying fluid.

In order to manufacture a semiconductor device, a desired pattern is formed on a substrate through various processes such as photolithography, etching, ashing, ion implantation, and thin film deposition. Various process liquids are used in each process, and contaminants and particles are generated during the process. In order to solve this problem, a cleaning process for cleaning contaminants and particles before and after each process is essentially performed.

Generally, in the cleaning step, the substrate is treated with a chemical and a rinsing liquid and then dried. In the drying treatment step, the substrate is dried with an organic solvent such as isopropyl alcohol (IPA) as a step for drying the rinsing liquid remaining on the substrate. However, as the distance (CD: critical dimension) between the pattern formed on the substrate and the pattern becomes finer, the organic solvent remains in the spaces between the patterns.

In order to remove the residual organic solvent, a supercritical treatment process is performed. The supercritical processing process processes the substrate by supplying a supercritical fluid to the substrate positioned in the chamber. The supercritical processing process proceeds in an atmosphere above the critical pressure and the critical temperature. FIG. 1 is a cross sectional view showing a general supercritical treating apparatus. Referring to FIG. 1, a fluid is supplied to the chamber 2 through a supply line 4. Before the fluid is supplied to the chamber 2, it is filtered by the filter 8, and the fluid can maintain a certain level of cleanliness.

When the supercritical treatment process is completed, the internal atmosphere of the chamber 2 is exhausted through a exhaust line 6 connected to the supply line 4. The connection point of the exhaust line 6 is located downstream of the filter 8. Accordingly, the internal atmosphere does not greatly affect the filter 8 when exhausting, while contaminants accumulate as the number of times of use of the filter 8 increases.

SUMMARY OF THE INVENTION

Embodiments of the inventive concept described herein relate to an apparatus and method which may improve the life of a filter installed in a fluid supply line.

Embodiments of the inventive concept described herein relate to an apparatus and method for cleaning contaminants accumulated in a filter without a separate maintenance work.

An embodiment of the inventive concept provides an apparatus and method for supplying a fluid. A substrate treating apparatus comprises a treating unit for treating a substrate and a fluid supply unit for supplying fluid to the treating unit, wherein the fluid supply unit comprises a supply tank in which the fluid is stored, a supply line connecting the supply tank and the treating unit to supply the fluid from the supply tank to the treating unit, a filter installed on the supply line, and an exhaust line branching from the supply line, wherein a branch point of the exhaust line in the supply line is located upstream of the filter.

The fluid supply unit further comprises a pressure-reducing member provided on the exhaust line for reducing the pressure of the exhaust line and controller for controlling a valve installed on the exhaust line, wherein the controller closes the exhaust line while treating the substrate in the treating unit, and may control the valve to open the exhaust line when treating the substrate in the treating unit is completed. The treating unit comprises a housing having a treatment space therein and a substrate support member for supporting the substrate in the treatment space, wherein the treatment space may be sealed from the outside during treating the substrate. The treating unit is a unit for treating a substrate with supercritical fluid and the fluid may comprise supercritical carbon dioxide ($CO_2$).

A unit for supplying fluid comprises a supply tank in which the fluid is stored, a supply line connecting the supply tank and the treating unit to supply the fluid from the supply tank to the treating unit, a filter installed on the supply line, and an exhaust line that branches off from the supply line, wherein a branch point of the exhaust line in the supply line is located upstream of the filter.

The unit comprises a pressure-reducing member provided on the exhaust line for reducing the pressure of the exhaust line and controller for controlling a valve installed on the exhaust line, wherein the controller may control the valve to move the fluid bi-directionally based on the filter.

A substrate treating method includes supplying a fluid filtered by a filter installed in a supply line to a treating unit to treat the substrate, wherein the fluid is bi-directionally moved in the supply line based on the filter.

The movement of the fluid in both directions includes a processing step in which the fluid is moved in one direction from the filter and supplied to the treating unit and a post-treatment step in which the fluid is moved in the opposite direction to the one direction after the processing step. The post-treatment step may be vented the fluid through an exhaust line branching from the supply line to a point upstream of the filter. The fluid may include supercritical carbon dioxide ($CO_2$).

According to an embodiment, the branch point of the exhaust line is located upstream of the filter with respect to the direction of supply of the fluid. As a result, the fluid can be moved in both directions based on the filter to clean the accumulated contaminants in the filter.

Also, according to an embodiment, it is possible to improve the life of the filter by cleaning the accumulated contaminants in the filter.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

The present invention describes an embodiment in detail referring to FIGS. 2 to 8.

Figure 2:
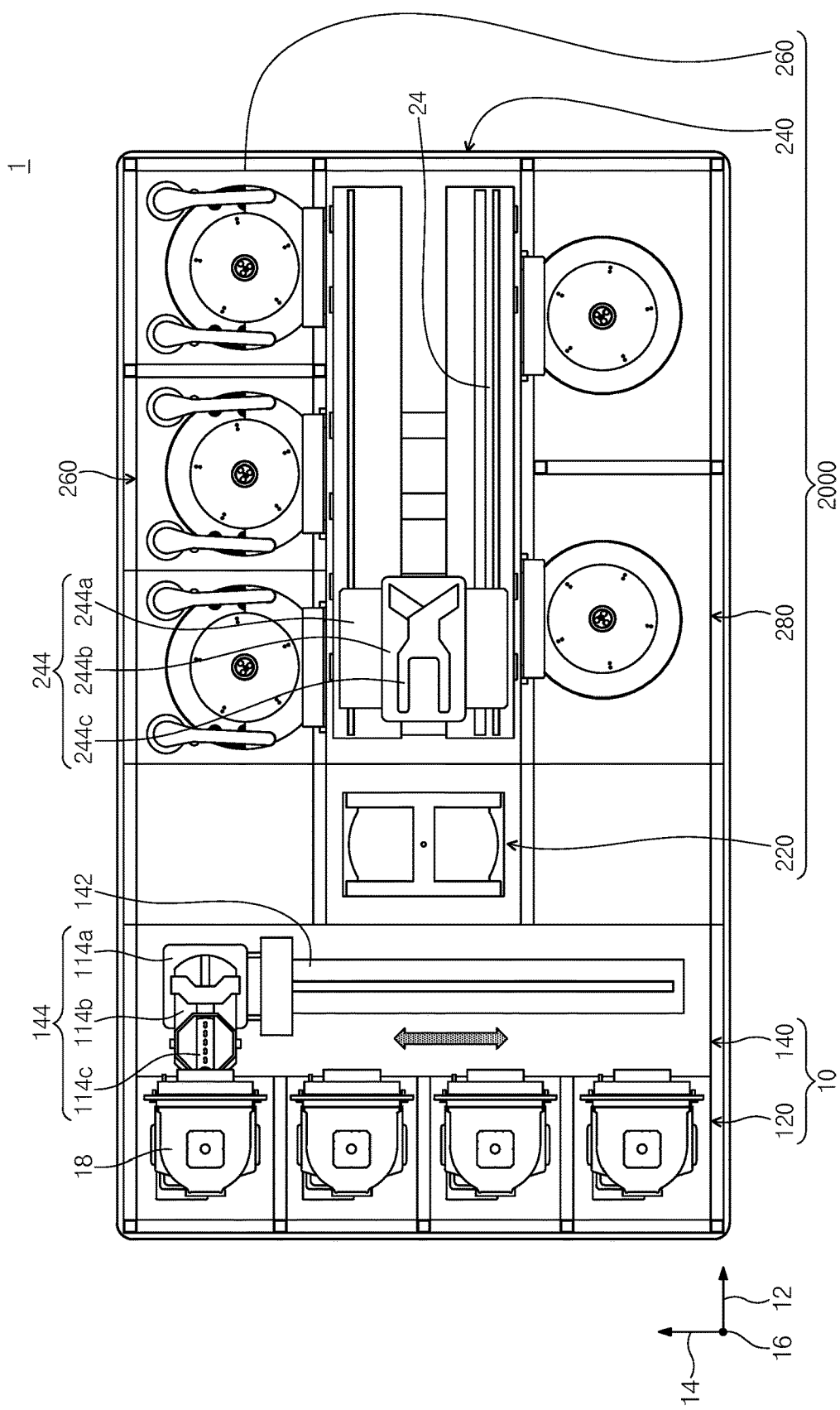
FIG. 2 is a plan view showing a substrate treating apparatus according to an embodiment of the present invention.

FIG. 2 is a plan view showing a substrate treating apparatus according to an embodiment of the present invention.

Referring to FIG. 2, a substrate treating apparatus 1 comprises an index module 10 and a process treating module 20. The index module 10 have a load port 120 and a transfer frame 140. The load port 120, the transfer frame 140, and the process treating module 20 are sequentially arranged in a row. Hereinafter, a direction where the load port 120, the transfer frame 140, and the process treating module are arranged is referred to as a first direction 12. And a direction perpendicular to the first direction 12 is referred to as a second direction 14, when view from a top side, and a direction perpendicular to a plane including the first direction 12 and the second direction 14 is referred to as a third direction 16.

Figure 1:
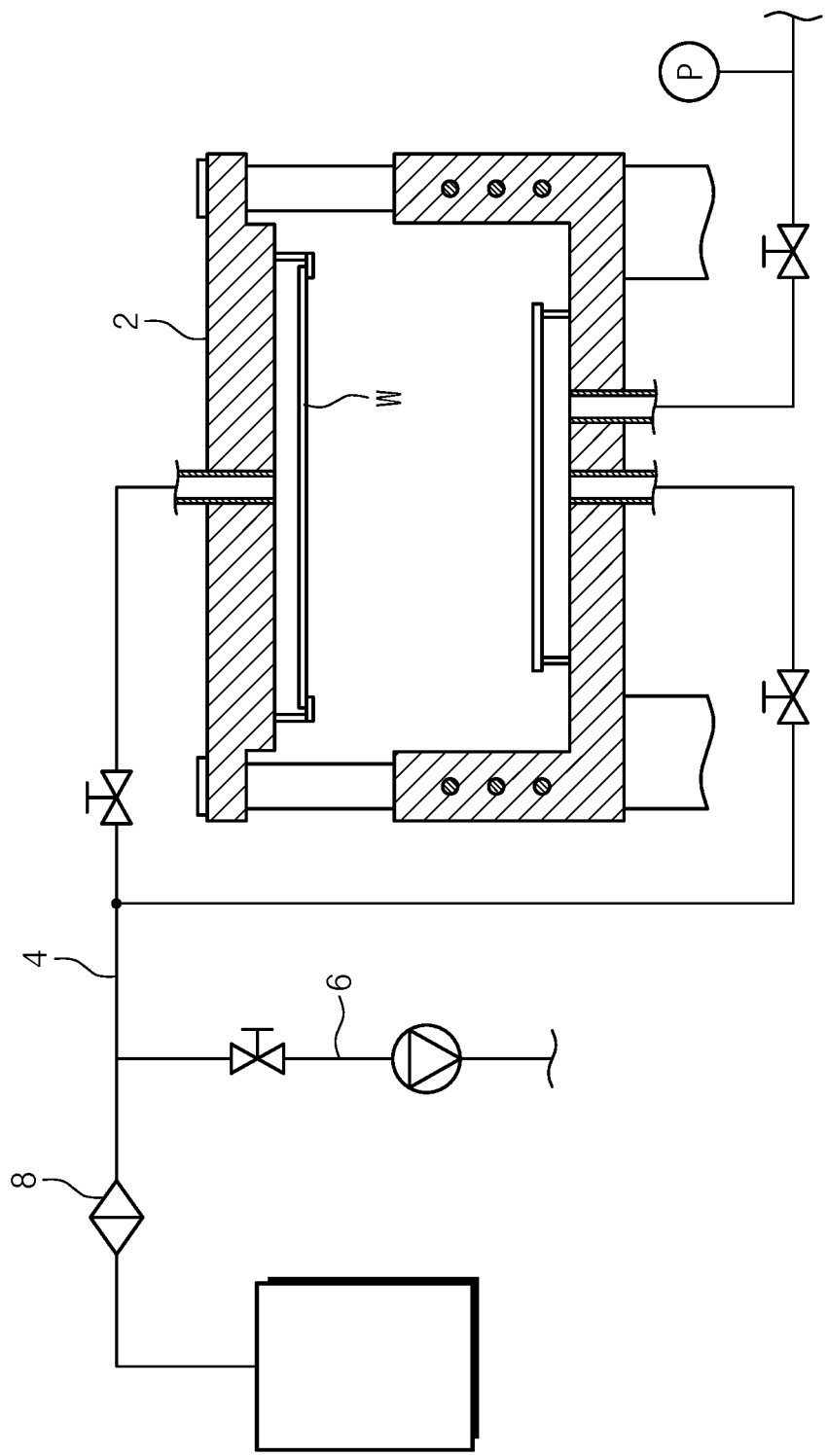
FIG. 1 is a cross sectional view showing a general supercritical treating apparatus.

A carrier 18 where a substrate W is stored is seated on the load port 120. The load port 120 is provided as a plurality of numbers and they are arranged in a row along the second direction 14. In the FIG. 1, it described that four load ports 120 are provided. However, the number of load ports 120 may be increased or decreased depending on a requirement like process efficiency and a footprint of the process treating module 20. In the carrier 18, a plurality of slots (not described) are provided to support an edge of the substrate W. A plurality of slots are provided along the third direction 16 and a plurality of substrates W is placed inside the carrier vertically stacked to each other along the third direction 16. A front opening unified pod (FOUP) may be used as the carrier 18.

The process treating module 20 comprises a buffer unit 220, a transfer chamber 240, a first process chamber 260, and a second process chamber 280. The transfer chamber 240 is provided such that the lengthwise direction thereof is parallel with the first direction 12. The first process chambers 260 are provided in one side of the transfer chamber 240 along the second direction 14 and the second process chambers 280 are provided in other side of the transfer chamber 240 along the second direction 14. The first process chambers 260 and the second process chambers 280 are provided symmetrically in one and the other sides of the transfer chamber 240. Some of the first process chambers 260 are placed along the lengthwise direction of the transfer chamber 240. Also, some of the first process chambers 260 are placed vertically stacked to each other. That is, in one side of the transfer chamber 240, the first process chambers 260 may be arranged in A×B (A and B are natural number of 1 or above) array. Herein, A is the number of the first process chambers 260 which are provided along the first direction 12, and B is the number of the first process chambers 260 which are provided along the third direction 16. When four or six first process chambers 260 are provided on one side of the transfer chamber 240, the first process chambers 260 may be arranged in 2×2 or 3×2 arrays. The number of the first process chamber 260 may be increased or decreased. The second process chambers 280 may be arranged in M×N (M and N are natural number of 1 or above) array similar to the first chambers 260. Here, M and N may be the same numbers as A and B, respectively. Unlike described above, the first process chamber 260 and the second process chamber 280 may be provided only on one side of the transfer chamber 240. Unlike described above, the first process chamber 260 and the second process chamber 280 may be provided as a single layer at both sides of the transfer chamber 240. Unlike described above, the first process chamber 260 and the second process chamber 280 may be provided in various arrangements.

The buffer unit 220 is arranged between the transfer frame 140 and the transfer chamber 240. The buffer unit provides a space for the substrate W to stay temporarily before transferring the substrate W between the transfer chamber 240 and the transfer frame 140. The slot (not described) where the substrate places is provided inside (e.g., inner wall) of the buffer unit 220, and the slots (not described) are provided with a plurality of numbers spaced apart from each other along the third direction 16. One side of the buffer unit 220 facing the transfer frame 140, and the other side of the buffer unit 220 facing the transfer chamber 240 are opened.

The transfer frame 140 transfers the substrate W between the buffer unit 220 and the carrier 18 seated on the load port 120. In the transfer frame 140, an index rail 142 and an index robot 144 are provided. The index rail 142 is provided such that the lengthwise direction is parallel to the second direction 14. The index robot 144 is installed on the index rail 142, and move linearly along the index rail 142 to the second direction 14. The index robot 144 comprises a base 144a, a body 144b, and an index arm 144c. The base 133a is installed movably along the index rail 142. The body 144b is coupled to the base 144a. The body 144b is provided movably along the third direction 16 on the base 144a. Also, the body 144b is provided rotatable on the base 144a. The index arm 144c is coupled to the body 144b, and is provided to move front and back to the body 144b. The index arm 144c is provided with a plurality of numbers and they are driven independently. The index arms 144c are arranged vertically, i.e., spaced apart from each other along the third direction 16. Some of the index arms 144c may be used when transferring the substrate W from the process treating module 20 to the carrier 18, and some may be used when transferring the substrate W from the carrier 18 to the process treating module 20. In this way, during the index robot 144 carries in or carries out the substrate W, particles that have come from a substrate before treating process may be prevented from adhering to a substrate after treating process.

The transfer chamber 240 transfers the substrate W among the first process chambers 260, the second process chamber 280 and the buffer unit 220. A guide rail 242 and a main robot 244 are provided in the transfer chamber 240. The guide rail 242 is places such that the lengthwise direction is parallel with the first direction 12.

The first process chamber 260 and the second process chamber 280 may be provided to perform a process sequentially on the substrate W. For example, the substrate W may be subjected to a chemical process, a rinsing process, and a first drying process in the first process chamber 260, and a second drying process may be performed in the second process chamber 260. In this case, the first drying process is performed by an organic solvent, and the second drying process may be performed by a supercritical fluid. Isopropyl alcohol (IPA) liquid may be used as the organic solvent, and carbon dioxide may be used as supercritical fluid. Alternatively, the first drying process in the first process chamber 260 may be omitted.

Figure 3:
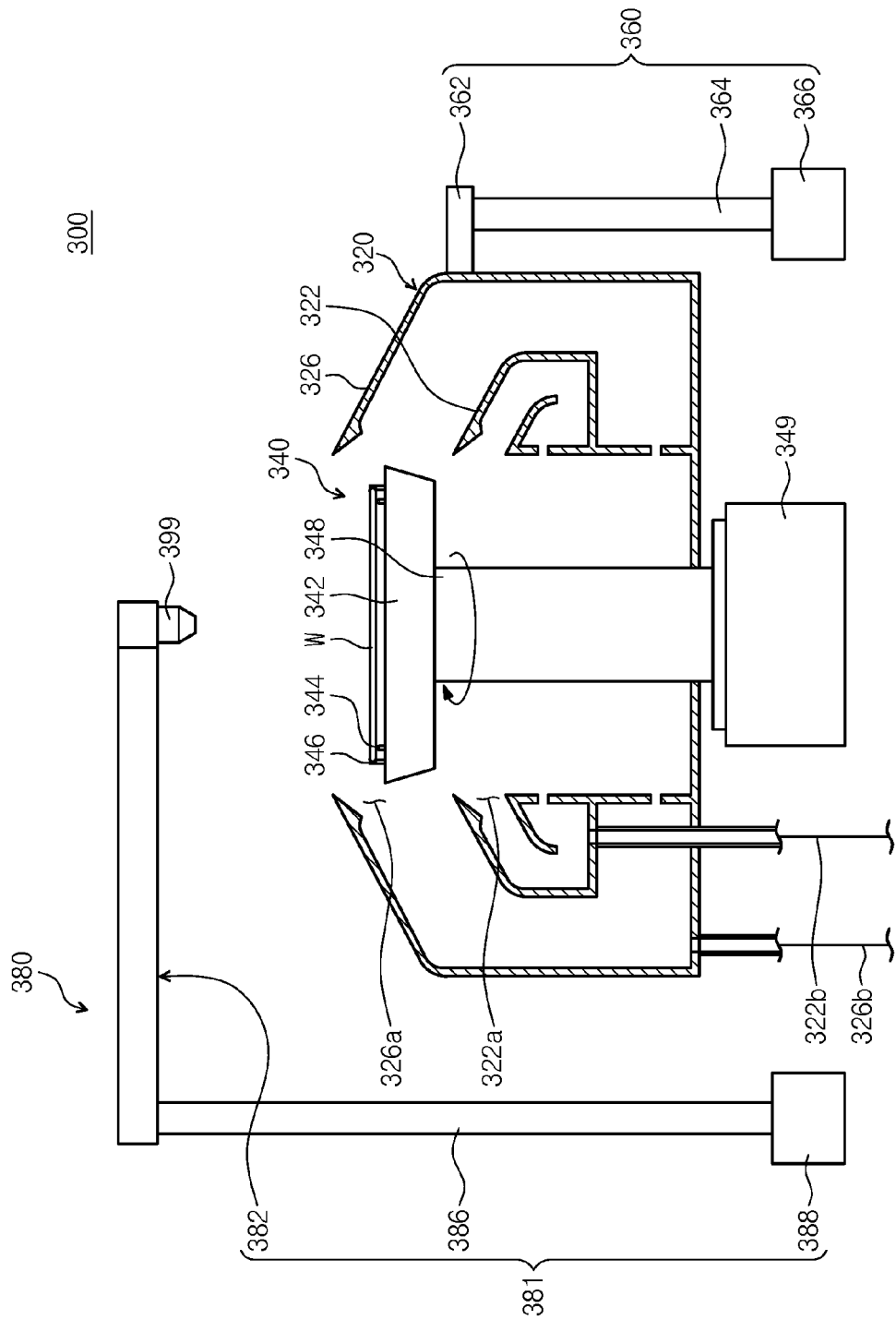
FIG. 3 is a cross-sectional view showing the apparatus for cleaning the substrate in the first process chamber of FIG. 2.

The following describes the apparatus 300 provided in the first process chamber 260. FIG. 3 is a cross-sectional view showing the apparatus for cleaning the substrate in the first process chamber of FIG. 2. Referring to FIG. 3, the substrate cleaning apparatus 300 has a treatment container 320, a spin head 340, an elevating unit 360, and an injection member 380. The treatment container 320 provides a space in which the substrate treating process is performed, and the upper portion thereof is opened. The treatment container 320 comprises an inner collecting container 322, and an outer collecting container 326. Each collecting containers 322, 324, 326 collects a treatment liquid that are different from each other among treatment liquids used in a process. The inner collecting container 322 is provided as a ring shape surrounding the spin head 340. The outer collecting container 326 is provided as a ring shape surrounding the inner collecting container 322. An inner space 322*a* of the inner collecting container 322 and an interspace 326*a* between the inner collecting container 322 and the outer collecting container 326 may function as a inlet where treatment liquid flows into the inner collecting container 322 and the outer collecting container 326, respectively. In the collecting containers 322, 326, collecting lines 322*b*, 326*b* are connected which are extended vertically downward to the bottom, respectively. Collecting lines 322*b*, 326*b* emit the treatment liquid inflow through the collecting containers 322, 326, respectively. The emitted treatment liquid may be reused through a treatment liquid regeneration system (not described) of outside.

The spin head 340 is placed inside of the treatment container 320. The spin head 340 supports the substrate W and rotates the substrate W during the substrate treating process. The spin head 340 comprises a body 342, a supporting pin 334, a chuck pin 346, and a supporting shaft 348. The body 342 has an upper surface usually provided as a circular form, when viewed from a top side. At the bottom of the body 342 the supporting shaft 348 rotatable by a motor 349 is fixedly connected. The supporting pin 334 is provided with a plurality of numbers. The plurality of supporting pins 334 are spaced apart from each other on edge of the upper surface of the body 342 and protrude upward from the body 342. The supporting pins 334 are generally arranged to have a ring shape. The supporting pin 334 supports the back side of the substrate W as to be spaced apart from the upper surface of the body 342. The chuck pin 346 is provided as a plurality number. The chuck pin 346 is arranged further apart from a center of the body 342 than the supporting pin 334. The chuck pin 346 is provided as to protrude upward from the body 342. The chuck pin 346 supports lateral part (side) of the substrate W such that the substrate W does not deviate from a right position to a side direction when the spin head 340 is rotating. The chuck pin 346 is provided to move linearly between standby position and supporting position along a radius direction of the body 342. The standby position is further apart from a center of the body 342 than the supporting position. When loading and unloading the substrate W on and from the spin head 340, and when processing the substrate W, the chuck pin 346 is placed on the supporting position. The chuck pin 346 on the supporting position is contacted with the lateral part of the substrate.

The elevating unit 360 moves the treatment container 320 linearly to up and down direction. As the treatment container 320 moves up and down, a height of the treatment container 320 relative to the spin head 340 is changed. The elevating unit 360 comprises a bracket 362, a moving shaft 364, and a driver 366. The bracket 362 is fixedly installed on outer wall of the treatment container 320. The moving shaft 364 moving up and down direction by the driver 366 is fixedly coupled to the bracket 362. When the substrate W is placed on the spin head 340 or when lifted from the spin head 340, the treatment container 320 descends such that the spin head 340 protrudes upward from the treatment container 320. Also, during processing, the height of the treatment container 320 are controlled such that the treatment liquid flows into the predetermined collecting container 360 depending on a kind of treatment liquid supplied in substrate W. For example, during treating the substrate W with the treatment liquid, the substrate W is placed on a height corresponding to the inner space 322*a* of the inner collecting container 322. Also, when treating the substrate W with the rinsing liquid, the substrate W is placed on a height corresponding to interspace 326*a* between the inner collecting container 322 and the outer collecting container 326. Unlike described above, the elevating unit 360 may move the spin head 340 up and down direction instead of the treatment container 320.

The injection member 380 supplies various types of treatment liquid onto the substrate W. The injection member 380 comprises an arm 382, a nozzle 399, a supporting shaft 386, and a driver 388. The supporting shaft 386 is provided such that its lengthwise direction is parallel with the third direction 16, and the driver 388 is coupled at the bottom of the supporting shaft 386. The driver 388 rotates and elevates the supporting shaft 386 up and down. The arm 382 is perpendicularly coupled to one end of the supporting shaft 386 which is opposite the other end of the supporting shaft 386 to which the driver 388 is coupled. The nozzle 399 is installed at the bottom of an end of the arm 382. The nozzle 399 is moved to a processing position and a standby position by the driver 388. The processing position is where the nozzle 399 is located vertically above the treatment container 320, and the standby position is where the nozzle 399 is not vertically above the treatment container 320, e.g. out of the processing position. The injection member 380 may be provided with one or a plurality of numbers. For example, the treatment liquid may include a chemical, a rinsing liquid, or an organic solvent. The chemical may be a strong acid or a strong base. The rinsing liquid may be pure. The organic solvent may be isopropyl alcohol solution (IPA).

The second process chamber 280 is provided with a substrate treating apparatus 400 on which a second drying process of the substrate W is performed.

Figure 4:
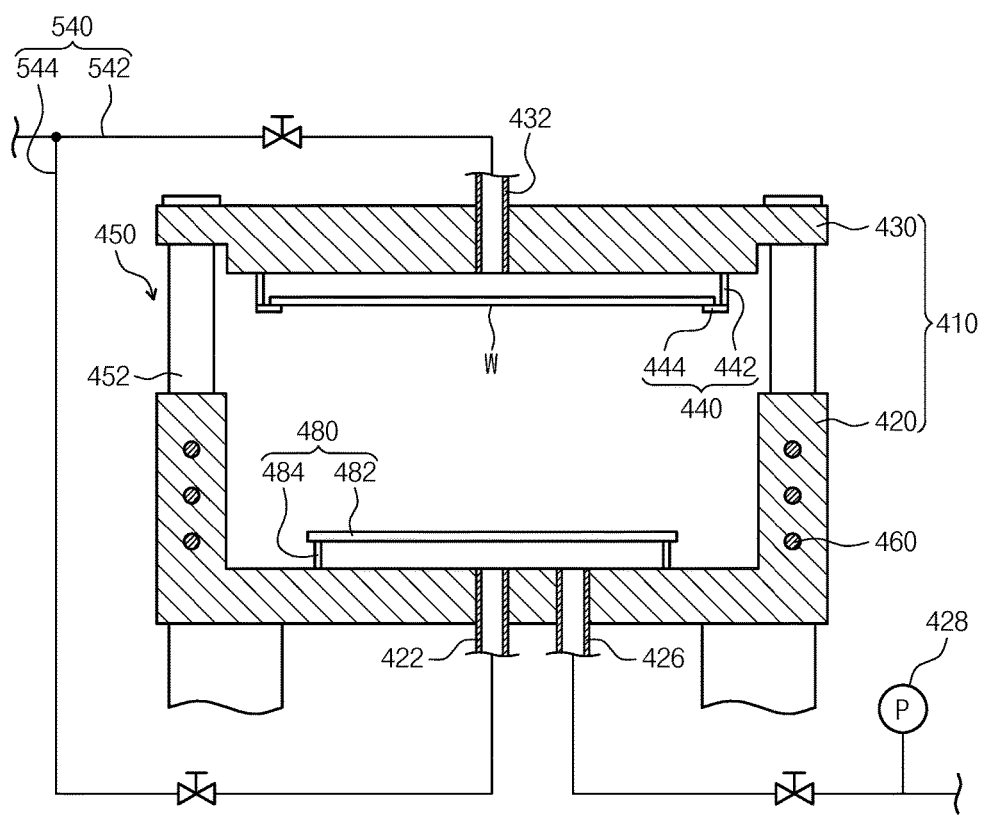
FIG. 4 is a cross-sectional view showing the apparatus for drying the substrate in the second process chamber of FIG. 2.

The substrate treating apparatus 400 performs second drying process on the substrate W which is dried primary in the first process chamber 260. The substrate treating apparatus 400 may dry the substrate W using a supercritical fluid. FIG. 4 is a cross-sectional view showing the apparatus for drying the substrate in the second process chamber of FIG. 2. Referring to FIG. 4, the substrate treating apparatus 400 comprises a treating unit 400 and a fluid supply unit 500. A treating process is performed in the treating unit 400, and the fluid supply unit 500 supplies a fluid to the treating unit 400.

The treating unit 400 comprises a housing 410, a substrate support member 440, a body elevating member 450, a heating member 460, and a blocking member 480.

The housing 410 forms a treatment space 412 for treating the substrate W therein. The housing 410 seals the treatment space 412 from the outside while treating the substrate W. The housing 410 comprises a lower body 420 and an upper body 430. The lower body 420 has a round cup shape with an open top. An exhaust port 426 and a lower supply port 422 are formed on the bottom surface of the lower body 420. When viewed from a top side, the lower supply port 422 may be positioned coincident with the center axis of the lower body 420. The exhaust port 426 may be positioned out of the central axis of the lower body 420. A pressure reducing member is connected to the exhaust port 426. The pressure reducing member regulates the pressure in the treatment space 412 during processing of the substrate. The exhaust port 426 may be provided with a pressure measurement sensor 428 capable of measuring the pressure. Particles generated during substrate processing can also be exhausted through the exhaust port 426.

The upper body 430 is combined with the lower body 420 to form a treatment space 412 therein. The upper body 430 is positioned above the lower body 420. The upper body 430 is provided in the shape of a circular plate. An upper supply port 432 is formed in the inner ceiling of the upper body 430. When viewed from below, the upper supply port 432 may be positioned to coincide with the center axis of the upper body 430. The same kind of fluid is supplied to the lower supply port 422 and the upper supply port 432, respectively. By the supply of the fluid, the treatment space is pressurized beyond the critical pressure. According to an example, each of the upper body 430 and the lower body 420 may be made of a metal material.

Figure 5:
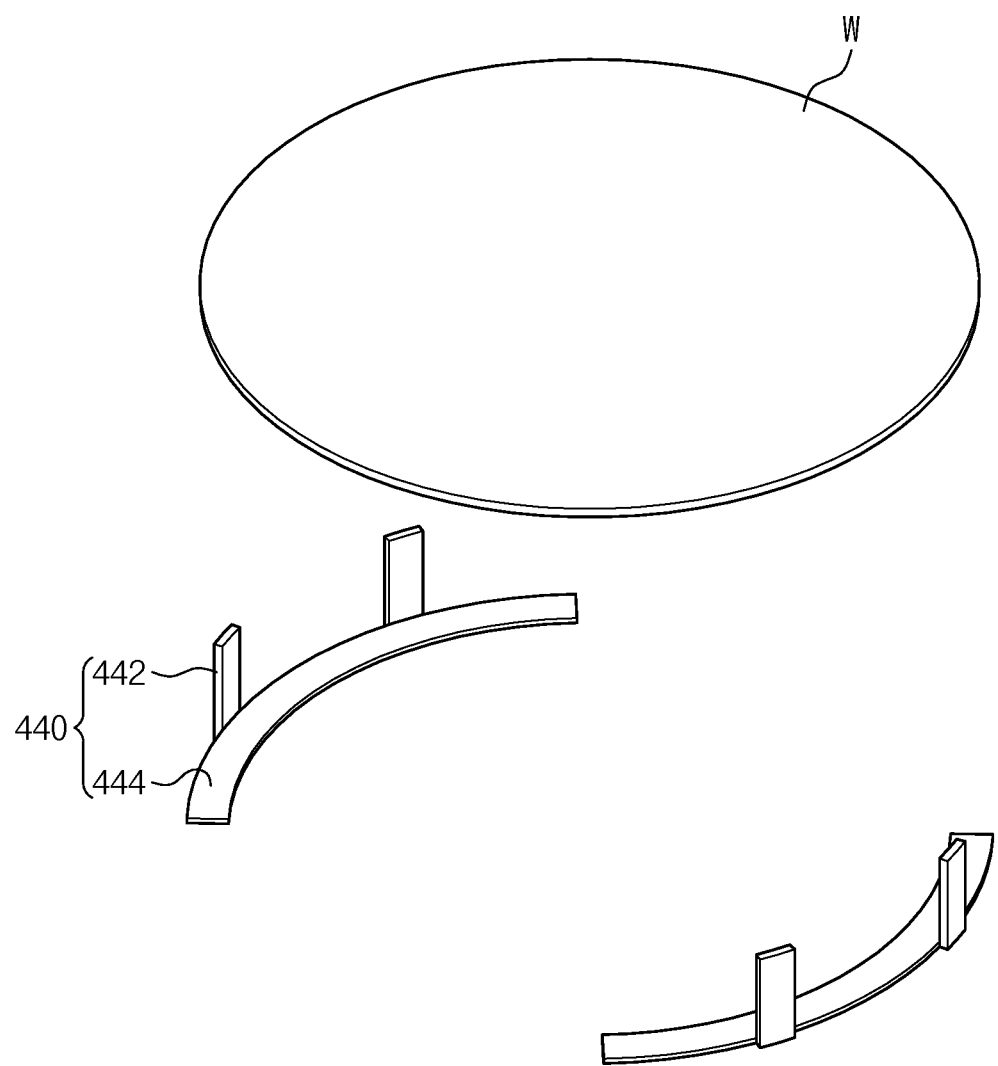
FIG. 5 is a perspective view showing the substrate support unit of FIG. 4.

The substrate support member 440 supports the substrate W in the treatment space 412. FIG. 5 is a perspective view showing the substrate support unit of FIG. 4. Referring to FIG. 5, the substrate support member 440 supports the substrate W such that the treating surface of the substrate W faces upward. The substrate support member 440 comprises a supporter 442 and a substrate supporter 444. The supporter 442 is provided in a bar shape extending downward from the inner ceiling surface of the upper body 430. A plurality of supporter 442 is provided. For example, the supporter 442 may be four. The substrate supporter 444 supports the bottom edge region of the substrate W. A plurality of substrate supporter 444 is provided, and each supports a different area of the substrate W. For example, the number of the substrate supporters 444 may be two. When viewed from a top side, the substrate supporter 444 is provided in a rounded blade shape. The substrate supporter 444 is positioned inside the supporter 442 when viewed from above. Each substrate supporter 444 is provided to have a ring shape in combination with each other. Each of the substrate supporters 444 is spaced apart from each other.

Again referring to FIG. 4, the body elevating member 450 adjusts the relative position between the upper body 430 and the lower body 420. The body elevating member 450 moves one of the upper body 430 and the lower body 420. In the embodiment, the position of the upper body 430 is fixed and the distance between the upper body 430 and the lower body 420 is adjusted by moving the lower body 420. Alternatively, the substrate support unit 440 may be installed on the fixed lower body 420, and the upper body 430 may be moved. The body elevating member 450 moves the lower body 420 such that the relative position between the upper body 430 and the lower body 420 is moved to the open position and the closed position. The open position is where the upper body 430 and the lower body 420 are spaced apart from each other such that the treatment space 412 communicates with the outside, and the closed position is where the upper body 430 and the lower body 420 are in contact with each other to thereby close the treatment space 412 from the outside. The body elevating member 450 moves up and down the lower body 420 to open or close the treatment space 412. The body elevating member 450 includes a plurality of elevating shafts 452 connecting the upper body 430 and the lower body 420 to each other. The elevating shafts 452 are positioned between the upper end of the lower body 420 and the upper body 430. The elevating shafts 452 are arranged to be arranged along the circumferential direction of the upper end of the lower body 420. Each elevating shaft 452 may be fixedly coupled to the upper end of the lower body 420 through the upper body 430. The height of the lower body 420 can be changed and the distance between the upper body 430 and the lower body 420 can be adjusted as the elevating shafts 452 move up and down.

The heating member 460 heats the treatment space 412. The heating member 460 heats the treatment space 412 above the critical temperature. The critical temperature is a temperature at which the fluid supplied to the treatment space can maintain a supercritical state. The heating member 460 may be embedded in the wall of at least one of the upper body 430 and the lower body 420. For example, the heating member 460 may be provided with a heater 460 that receives power from the outside and generates heat.

The blocking member 480 prevents the fluid supplied from the lower supply port 422 from being directly supplied to the non-treated surface of the substrate W.

Figure 6:
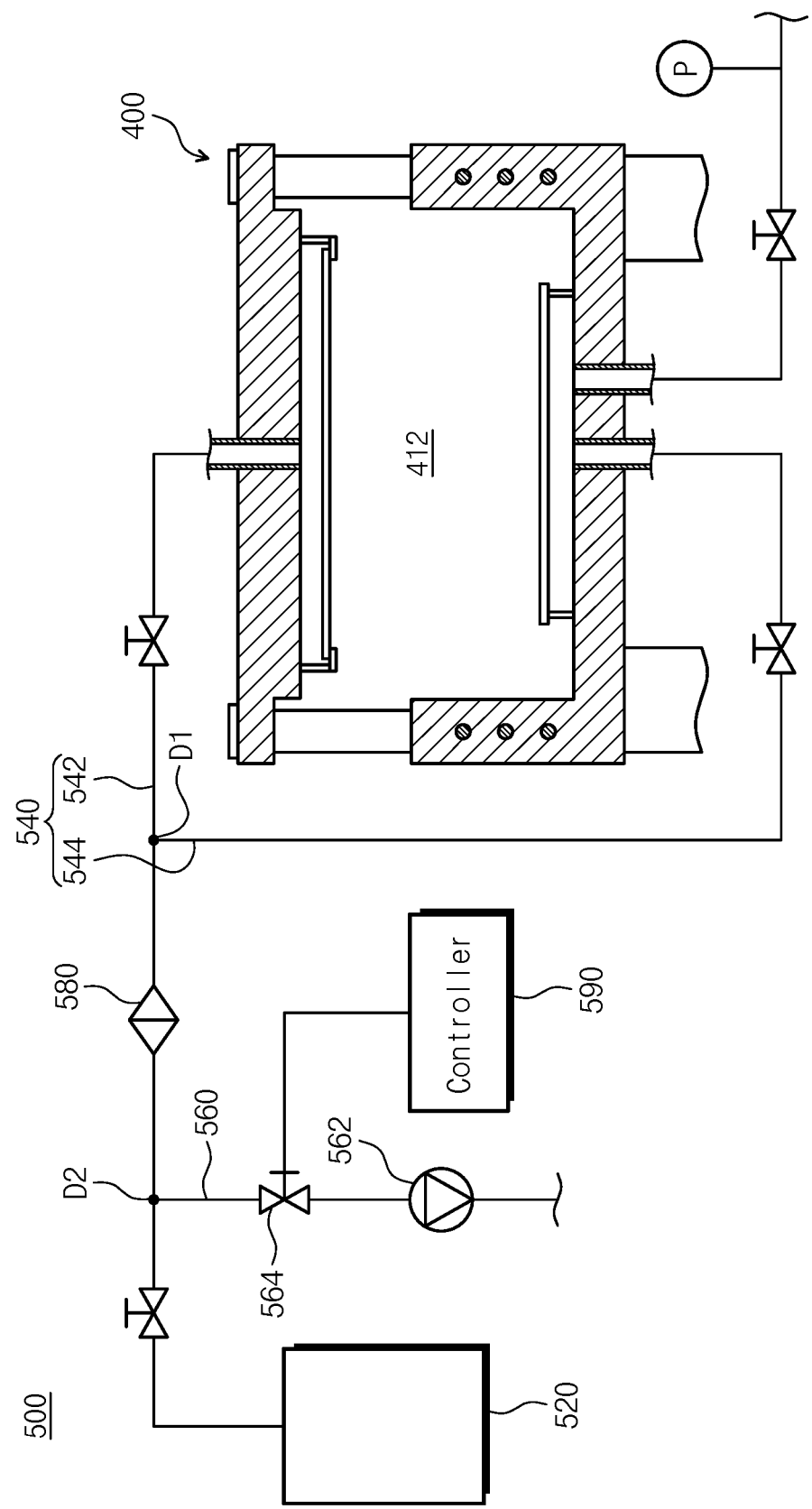
FIG. 6 is a view showing the fluid supply unit of FIG. 4.

The fluid supply unit 500 supplies fluid to the treatment space 412. FIG. 6 is a view showing the fluid supply unit of FIG. 4. Referring to FIG. 6, the fluid supply unit 500 comprises a supply tank 520, a supply line 540, a filter 580, an exhaust line 560, and a controller 590. The supply tank 520 stores fluid therein. According to an example, the fluid may be carbon dioxide ($CO_2$). The fluid filled in the supply tank 520 is supplied to the treatment space through the supply line 540. The supply line 540 connects the supply tank 520 and the housing. The supply line 540 has an upper line 542 and a lower line 544. The upper line 542 connects the supply tank 520 and the upper supply port 432. The lower line 544 branches from the upper line 542 and is connected to the lower supply port 422. Thus, the fluid can be supplied to the treatment space through the upper supply port 432 and the lower supply port 422, respectively.

The filter 580 maintains a certain degree of cleanliness of the fluid flowing through the supply line 540. The filter 580 filters foreign matter contained in the fluid. The filter 580 is installed in an upper line 542. The filter 580 is located upstream of a point D1 (hereinafter referred to as a first point) where a lower line 544 branches with respect to the fluid supply direction.

The exhaust line 560 branches off from the upper line 542. The point D2 (hereinafter referred to as the second point) where the exhaust line 560 branches is located upstream of the filter 580 with respect to the direction in which the fluid is supplied in the treatment space 412. That is, the filter 580 is positioned between the first point D1 and the second point D2 in the upper line 542. A pressure reducing member 562 is provided in the exhaust line 560. The pressure reducing member 562 decompresses the exhaust line 560. The treatment space in which the treating process of the substrate W is completed may be decompressed by the pressure reducing member 562. Therefore, the pressure of the treating space may be reduced through the supply line 540 and the exhaust line 560 sequentially.

The controller 590 controls a valve 564 installed in the exhaust line 560. As the valve 564 is opened and closed, the exhaust line 560 is closed during the drying process of the substrate W in the processing space, and when the drying process of the substrate W is completed, the exhaust line 560 is opened.

A process of treating the substrate W using the above-described substrate treating apparatus will be described. When the treatment space 412 is opened from the outside, the substrate W treated in the first process chamber 300 is carried into the housing 410. The substrate W is carried in a state in which the organic solvent remains on the treated surface. When the substrate W is loaded on the substrate support member 440, the treatment space 412 is sealed from the outside, and the processing step and the post-treatment step are sequentially performed.

Figure 7:
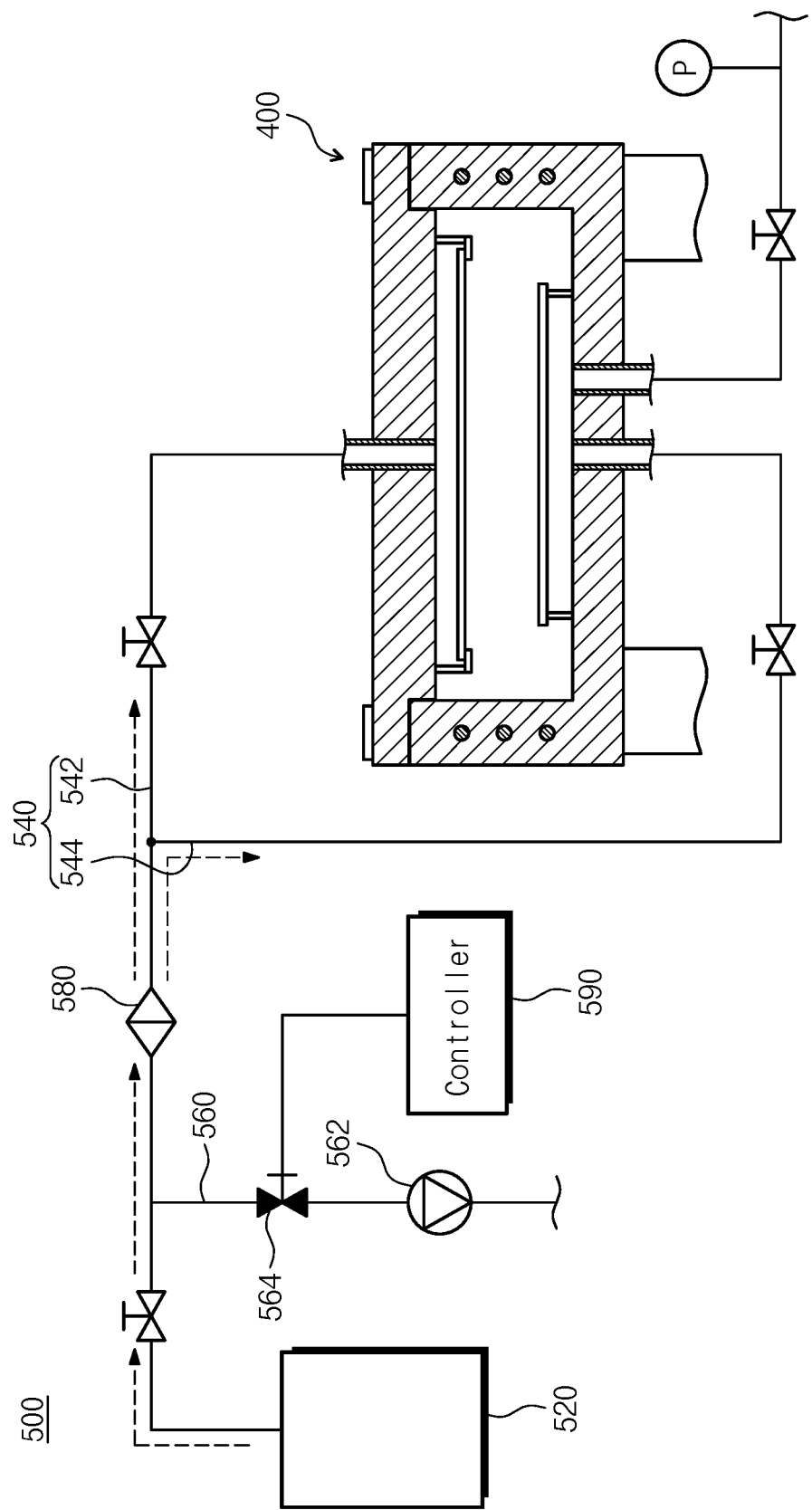
FIGS. 7 and 8 are views showing a process of treating a substrate using the fluid supply unit of FIG. 6.
Figure 8:
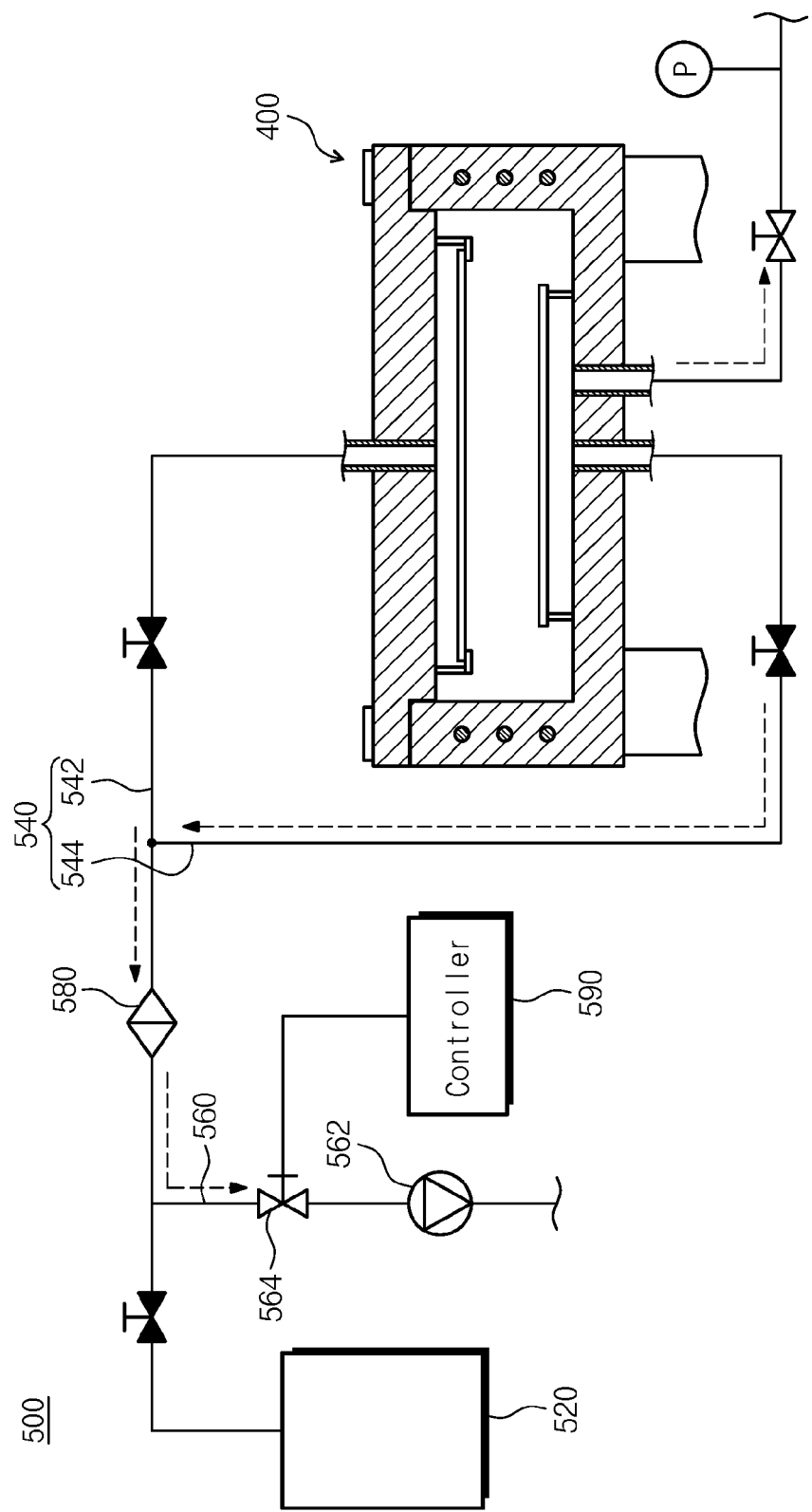

Referring to FIGS. 7 and 8, the processing step is a step of removing the organic solvent remaining on the substrate W. In the processing step, the fluid supplied from the fluid supply unit 500 is supplied to the treatment space 412. Fluid is filtered by filter 580 and is provided to a direction towards the treating unit. The fluid is first supplied to the lower supply port 422 faced to the untreated surface of the substrate W. Then the fluid is supplied from each of the upper supply port 432 and the lower supply port 422, which face the treating surface of the substrate W.

This is to prevent the initially supplied fluid from being supplied to the substrate W with the critical pressure or the critical temperature not yet reached. When the drying process of the substrate W is completed, a post-treatment step is performed.

The post-treatment step is a step of lowering the treating space 412 to atmospheric pressure and cleaning the filter 580. In the post-treatment step, the atmosphere of the treatment space 412 is exhausted through the exhaust line 560. The exhaust line 560 is opened and the atmosphere of the treatment space 412 is exhausted through the supply line 540 and the exhaust line 560 in sequence. At this time, the atmosphere in the treatment space 412 is exhausted in the reverse direction, which is the direction opposite to the one direction, which is the supply direction of the fluid. The atmosphere of the treatment space 412 is moved in the opposite direction and passes through the filter 580. At this time, the contaminants accumulated in the filter 580 are back-cleaned along the reverse direction. The contaminants accumulated in the filter 580 are exhausted to the exhaust line 560 together with the atmosphere of the treatment space 412.

When the post-treatment step is completed, the lower body 420 is lowered and the treatment space 412 is opened. The substrate W on which the second drying process has been completed is taken out of the treating unit 400.

In the above described embodiment, the fluid flowing in the supply line 540 is bi-directionally moved with respect to the filter 580. This causes the fluid to move in one direction, which is the supply direction, to be filtered by the filter 580, and to move backward to back-clean the filter 580.

What is claimed is:

1. A substrate treating apparatus comprising:
   a treating unit for treating a substrate; and
   a fluid supply unit for supplying fluid to the treating unit, wherein the fluid supply unit comprises:
   a supply tank in which the fluid is stored;
   a supply line connecting the supply tank and the treating unit to supply the fluid from the supply tank to the treating unit;
   a filter installed on the supply line; and
   an exhaust line branching from the supply line,
   wherein a branch point of the exhaust line in the supply line is located upstream of the filter.

2. The apparatus of claim 1, wherein the fluid supply unit further comprising:
   a pressure-reducing member provided on the exhaust line for reducing the pressure of the exhaust line; and
   a controller for controlling a valve installed on the exhaust line,
   wherein the controller closes the exhaust line while treating the substrate in the treating unit, and control the valve to open the exhaust line when treating the substrate in the treating unit is completed.

3. The apparatus of claim 2, wherein the treating unit comprising:
   a housing having a treatment space therein; and
   a substrate support member for supporting the substrate in the treatment space,
   wherein the treatment space is sealed from outside during treating the substrate.

4. The apparatus of claim 1, wherein the treating unit is a unit for treating a substrate with supercritical fluid and the fluid comprises supercritical carbon dioxide ($CO_2$).

5. A fluid supply unit comprises:
   a supply tank in which fluid is stored;
   a supply line connecting the supply tank and a treating unit to supply the fluid from the supply tank to the treating unit;
   a filter installed on the supply line; and
   an exhaust line that branches off from the supply line,
   wherein a branch point of the exhaust line in the supply line is located upstream of the filter.

6. The fluid supply unit of claim 5, wherein the unit comprising:
   a pressure-reducing member provided on the exhaust line for reducing the pressure of the exhaust line; and
   a controller for controlling a valve installed on the exhaust line,
   wherein the controller controls the valve to move the fluid bi-directionally based on the filter.

7. A substrate treating method comprises supplying a fluid filtered by a filter installed in a supply line to a treating unit to treat the substrate, wherein the fluid is bi-directionally moved through the supply line in a first direction and a second direction opposite to the first direction based on the filter, respectively,
   wherein the fluid is further moved through an exhaust line branching from the supply line, and a branch point of the exhaust line in the supply line is located upstream of the filter with respect to the first direction.

8. The method of claim 7 comprises a movement of the fluid in both directions comprising:
   a processing step in which the fluid is moved in the first direction from the filter and supplied to the treating unit; and
   a post-treatment step in which the fluid is moved in the second direction after the processing step.

9. The method of claim 8, wherein the post-treatment step is vented the fluid through the exhaust line branching from the supply line.

10. The method of claim 7, wherein fluid may include supercritical carbon dioxide (CO2).

* * * * *